United States Patent [19]

Liu

[11] Patent Number: 4,511,640

[45] Date of Patent: Apr. 16, 1985

[54] AQUEOUS DEVELOPABLE DIAZO LITHOGRAPHIC PRINTING PLATES WITH ADMIXTURE OF POLYVINYL ACETATE AND STYRENE MALEIC ACID ESTER COPOLYMER

[75] Inventor: Shuchen Liu, Clinton, N.J.

[73] Assignee: American Hoechst Corporation, Somerville, N.J.

[21] Appl. No.: 525,927

[22] Filed: Aug. 25, 1983

[51] Int. Cl.³ .................. G03C 1/60; G03F 7/08
[52] U.S. Cl. ................... 430/157; 430/158; 430/160; 430/175; 430/176; 430/909; 430/910; 430/302
[58] Field of Search ............. 430/175, 176, 157, 160, 430/158, 909, 910, 302

[56] References Cited

U.S. PATENT DOCUMENTS

| | | |
|---|---|---|
| 2,822,271 | 2/1958 | Krieger . |
| 2,980,534 | 4/1961 | Printy et al. ................. 430/289 |
| 3,382,069 | 5/1968 | Borchers et al. . |
| 3,396,019 | 8/1968 | Uhlig ............................. 430/175 |
| 3,467,523 | 7/1965 | Seidel et al. . |
| 3,544,317 | 12/1970 | Yonezawa . |
| 3,573,052 | 3/1971 | Gray et al. . |
| 3,725,069 | 4/1973 | Hammond ..................... 430/175 |
| 3,847,614 | 11/1974 | Mattor ........................... 430/175 |
| 3,849,392 | 11/1974 | Steppan ......................... 430/175 |
| 3,890,152 | 6/1975 | Ruckert et al. ................ 430/175 |
| 3,933,499 | 1/1976 | Traskes . |
| 4,186,069 | 1/1980 | Muzyczko et al. . |
| 4,275,138 | 6/1981 | Kita et al. . |
| 4,288,520 | 9/1981 | Sprintschnik et al. . |
| 4,294,905 | 10/1981 | Okishi et al. .................. 430/175 |

FOREIGN PATENT DOCUMENTS

| | | | |
|---|---|---|---|
| 1313777 | 4/1973 | United Kingdom | 430/175 |
| 1525757 | 9/1978 | United Kingdom | 430/160 |

*Primary Examiner*—Charles L. Bowers, Jr.
*Attorney, Agent, or Firm*—Richard S. Roberts; James R. Cartiglia

[57] ABSTRACT

An improved negative working photographic element is prepared by coating a suitable substrate with a photosensitive composition comprising a light sensitive diazonium salt and a binder composition comprising a polyvinyl acetate resin and a styrene/maleic acid half ester copolymer. Upon imagewise exposure of the element to actinic radiation through a suitable mask, the unexposed portions are removable with an aqueous developer.

18 Claims, No Drawings

AQUEOUS DEVELOPABLE DIAZO LITHOGRAPHIC PRINTING PLATES WITH ADMIXTURE OF POLYVINYL ACETATE AND STYRENE MALEIC ACID ESTER COPOLYMER

BACKGROUND OF THE INVENTION

The present invention relates to improved photographic elements. More particularly, this invention relates to an improved lithographic printing plate which employs novel photosensitive compositions which are developable in aqueous developers.

Most such photographic elements comprise a metal sheet substrate which is coated with a light sensitive diazonium compound in admixture with suitable binding resins, colorants, stabilizers, exposure indicators, surfactants, and the like.

While the art discloses a plethora of photosensitive compositions useful for lithographic purposes, their serviceability is limited by the need to develop them with solutions containing substantial amounts of organic solvents. This is undesirable since these solvents are costly and their effluent is environmentally harmful.

The present invention seeks to reduce or eliminate the need for such solvents in lithographic systems by providing a photographic element with a coating using a particular class of binding resins such that the exposed element is developable with a substantially aqueous based developer composition. Simultaneously the element shows no substantial attack to its image areas and the removed non-image area resins are substantially not re-deposited or re-adhered back onto the element after removal.

SUMMARY OF THE INVENTION

The present invention provides a photographic element, capable of being developed with a substantially aqueous developer after being imagewise exposed to actinic radiation, which comprises a negative working, light sensitive diazonium salt and a binding resin composition comprising or consisting essentially of a polyvinyl acetate polymer and a styrene/maleic acid half ester copolymer.

By the term "substantially aqueous developer" it is meant, one which contains aqueous solutions of salts and surfactants and less than about 10% by weight of organic solvents. Preferably the developer contains no more than about 5%, more preferably no more than about 2% and most preferably 0% of such organic solvents.

DETAILED DESCRIPTION OF THE PREFERRED EMBODIMENT

As the first step in the production of the photographic element, a sheet substrate such as aluminum and the alloys thereof, especially those aluminum compositions suitable for the manufacture of lithographic printing plates such as, Alcoa 3003 and Alcoa 1100, which may or may not have been pretreated by standard graining and/or etching and/or anodizing techniques as are well known in the art, and also may or may not have been treated with a composition, such as polyvinyl phosphonic acid, suitable for use as a hydrophilizing layer for lithographic plates is coated with the radiation sensitive diazo composition disclosed herein.

The photosensitive sheet material is then exposed through a mask or transparency, to a radiation source and the exposed sheet then developed for removal of unexposed photosensitive materials.

The light sensitive composition comprises an admixture of a diazonium salt, a polyvinyl acetate resin, and a styrene/maleic acid half ester copolymer. The mixture is usually prepared in a solvent composition which is compatible with all the composition ingredients. The composition is then coated on the substrate and the solvent dried off. The composition may also contain other art recognized ingredients such as colorants, acid stabilizers and exposure indicators.

Diazonium compounds most commonly employed in the preparation of light sensitive compositions suitable for the present application may be characterized by the generic structure $A-N_2^+X^-$, wherein A is an aromatic or heterocyclic residue and X is the anion of an acid. Specific examples of light sensitive diazonium materials useful as aforementioned include higher molecular weight compositions obtained, for example, by the condensation of certain aromatic diazonium salts in an acid condensation medium with active carbonyl compounds such as formaldehyde, as disclosed for example in U.S. Pat. Nos. 2,063,631 and 2,667,415. A preferred class of diazonium compounds is described in U.S. Pat. No. 3,849,392.

A most preferred diazonium salt is the polycondensation product of 3-methoxy-4-diazo-diphenyl amine sulfate and 4,4'-bis-methoxy methyl-diphenyl ether, precipitated as mesitylene sulfonate, as taught in U.S. Pat. No. 3,849,392.

The polyvinyl acetate resin useful for the practice of the present invention has an average molecular weight in the range of from about 100,000 to less than 800,000. A preferred average molecular weight maximum is about 700,000; more preferably 680,000. The most preferred average molecular weight is in the range of about 100,000 to 380,000. Polyvinyl acetate resins useful within the context of the invention non-exclusively include Mowilith ® 25, 30, 50 and 60 available from Hoechst AG, Frankfurt, West Germany.

The styrene/maleic acid half ester copolymer useful within the context of the present invention has the general formula:

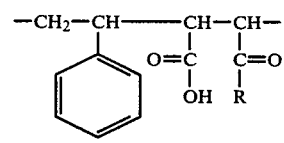

wherein R is a lower aliphatic alcohol residue having from 1 to about 5 carbon atoms. A styrene component always appears as end-capping members of the copolymer chain. Therefore the ratio of styrene to maleic acid half ester in the copolymer is 1:<1.

The copolymer has an average molecular weight of not more than about 50,000, and is preferably less than about 50,000.

Preferably, the average molecular weight falls in the range of from about 10,000 to about 50,000. One particularly preferred copolymer useful within the context of the present invention is Scripset ® 540, available from Monsanto, which has an approximate average molecular weight of about 20,000.

Suitable acid stabilizers useful within the context of the present invention include phosphoric, citric, tartaric and p-toluene sulfonic acids.

Exposure indicators useful in conjunction with the present invention include para phenyl azo diphenyl amine, Calcozine Fuchine dyes and Crystal Violet and Methylene Blue dyes.

Non-limiting examples of colorants useful with the photographic element of the present invention include such dyes as Acetosol Fire Red 3GLS, Sandolan Eosin E-G, Acetosol Green BLS, Genacryl Blue 3G, Sandolan Cyanine N-6B, Sandoplast Blue R, Atlantic Alizarine Milling Blue FFR 200, Neozapon Fiery Red BL, Erythrosine, Methylene Blue IaD Extra, Victoria Pure Blue FGA; and such pigments as Geen Gold Pigment and Sunfast Violet.

The diazonium salt is preferably present in the coating composition in an amount of from about 20% to about 50% by weight of the solid composition components. A more preferred range is from about 25% to 45% and most preferably from about 30% to 40%.

The polyvinyl acetate resin is preferably present in the coating composition in an amount of from about 8% to about 33% by weight of the solid composition components. A more preferred range is from about 12% to 28% and most preferably from about 18% to 23%.

The styrene/maleic acid half ester copolymer is preferably present in the coating composition in an amount of from about 25% to about 55% by weight of the solid composition components. A more preferred range is from about 32% to 48% and most preferably from about 37% to 43%.

The acid stabilizer, when one is used, is preferably present in the coating composition in an amount of from about 1.5% to about 4.5% by weight of the solid composition components. A more preferred range is from about 2.0% to 4.0% and most preferably from about 2.5% to 3.5%.

The exposure indicator, when one is used, is preferably present in the coating composition in an amount of from about 0.05% to about 0.35% by weight of the solid composition components. A more preferred range is from about 0.10% to 0.30% and most preferably from about 0.15% to 0.25%.

The colorant, when one is used, is preferably present in the coating composition in an amount of from about 0.25% to about 0.55% by weight of the solid composition components. A more preferred range is from about 0.30% to 0.50% and most preferably from about 0.35% to 0.45%.

Suitable solvents which may be used as a medium to combine the ingredients of the present composition include Methyl Cellosolve, ethylene glycol ethers, butyrolactone, such alcohols as ethyl alcohol and n-propanol, and ketones such as methyl ethyl ketone. In general said solvents are evaporated from the coating once it is applied to an appropriate substrate, however some insignificant amount of solvent may remain as a residue.

Substrates useful for production of the photographic element of the present invention non-exclusively incude transparent films, aluminum alloys, silicon and similar materials which are well known in the art.

In the production of lithographic printing plates, an aluminum containing substrate is first preferably grained by art recognized methods such as by means of a wire brush, slurry of particulates or electrochemical means, for example in a hydrochloric acid electrolyte. The grained plate may then be anodized, for example in sulfuric or phosphoric acid in a manner well known in the art. The grained and anodized surface may then be rendered hydrophilic, for example, by treatment with polyvinyl phosphonic acid, sodium silicate, or the like, which means are also known to the skilled artisan. The thusly prepared plate is then coated with the composition of the present invention, dried, exposed to actinic radiation through an appropriate mask and developed with an aqueous based developer.

A suitable developer useful for the photographic element of the present invention includes an aqueous alkaline solution containing (a) a sodium, potassium or lithium salt of octyl, decyl or dodecyl monosulfate;

(b) a sodium, lithium, potassium or ammonium metasilicate salt; and (c) a lithium, potassium, sodium or ammonium borate salt; and (d) an aliphatic dicarboxylic acid, or sodium, potassium or ammonium salt thereof having from 2 to 6 carbon atoms; and (e) di- and/or tri-sodium or -potassium phosphate.

The following non limiting examples serve to demonstrate the invention.

EXAMPLE 1

A coating solution is prepared according to the following composition:

| | |
|---|---|
| Phosphoric Acid (85%) | 0.447 g. |
| Polyvinyl Acetate (Mowilith 60, Hoechst AG) | 2.790 g. |
| Polystyrene/maleic acid half ester (Scripset 540, Monsanto) | 5.581 g. |
| Para Phenylazo diphenylamine | 0.030 g. |
| Acetosol Fire Red 3GLS (Sandoz) | 0.056 g. |
| Diazonium Compound according to the teaching of U.S. Pat. No. 3,849,392 | 5.023 g. |

The above ingredients are added sequentially in 450 g of Methyl Cellosolve (monoethyl ether of ethylene glycol) with vigorous stirring. After all the ingredients are dissolved, the solution is filtered and whirler coated at 70 rpm on a slurry grained and hydrophilized aluminum surface. Upon drying, the plate is exposed in a Berkey/Ascor (24"×28") exposure unit through negative film using 300 mj/cm$^2$ so as obtained an acceptable step on a standard Stauffer 21 stepwedge. The exposed plate is developed with an aqueous alkaline developer containing the following ingredients

| | |
|---|---|
| H$_2$O | 91.7 |
| sodium octyl sulfate | 2.5 |
| sodium metasilicate | 0.1 |
| disodium phosphate | 1.5 |
| trisodium phosphate | 1.5 |
| potassium oxalate | 1.7 |
| potassium tetraborate | 1.0 | which removes the unexposed areas, leaving the exposed area as image. The plate is rinsed with an aqueous solution containing about 10% of hydrolyzed tapioca starch and 0.5% of phosphoric acid. The prepared plate is mounted on an offset sheet fed press under normal printing conditions and it provides 30,000 quality impressions.

EXAMPLE 2

Example 1 is repeated except the polyvinyl acetate is eliminated. The imaged area displays attack by the developer, since shortened stepwedge, sharpening halftone dots and a coating weight loss is observed.

EXAMPLE 3

Example 1 is repeated except the polystyrene/maleic acid half ester is eliminated. Unacceptable amounts of removed non-image area coating are redeposited onto the image areas of the plate. Such an occurance is generally not associated with quality printing.

EXAMPLE 4

Example 1 is repeated except Mowilith 25 having molecular weight of 100,000 instead of Mowilith 60 is used. The results are comparable to Example 1.

EXAMPLE 5

Example 1 is repeated except the described solution is coated on a slurry grained, anodized and hydrophilized aluminum surface. The prepared plate is mounted on an offset sheet fed press under normal printing conditions and it provides 60,000 quality impressions.

EXAMPLE 6

Example 1 is repeated except the described solution is coated on an electrochemically grained and hydrophilized aluminum surface. The prepared plate is mounted on an offset sheet fed press, under normal printing conditions, and it provides 300,000 quality impressions.

EXAMPLE 7

Example 1 is repeated except that Mowilith 60 is replaced by AYAT (polyvinyl acetate from Union Carbide). The results are comparable to Example 1.

What is claimed is:

1. An aqueous developable photosensitive lithographic printing plate composition which comprises, in admixture, about 20% to about 50% by weight of a light sensitive, negative working diazonium salt; about 8% to about 33% by weight of a polyvinyl acetate resin having an average molecular weight in the range of from about 100,000 to less than about 800,000; and about 25% to about 55% by weight of a styrene end-capped, styrene/maleic acid half ester co-polymer of the formula

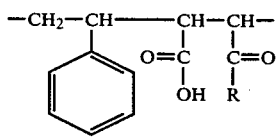

wherein R is a lower aliphatic alcohol residue having from 1 to about 5 carbon atoms and wherein said polymer has an average molecular weight of not more than about 50,000.

2. The composition of claim 1 wherein the diazonium salt is present in an amount of from about 30% to about 40% by weight of the composition.

3. The composition of claim 1 wherein the polyvinyl acetate resin is present in an amount of from about 18% to about 23% by weight of the composition.

4. The composition of claim 1 wherein the styrene/maleic acid half ester copolymer is present in an amount of from about 37% to about 43% by weight of said composition.

5. The composition of claim 1 wherein the diazonium salt is present in an amount of from about 30% to about 40%, and wherein the polyvinyl acetate resin is present in an amount of from about 18% to about 23%, and wherein the styrene/maleic acid half ester copolymer is present in an amount of from about 37% to about 43% by weight of said composition.

6. The composition of claim 1 wherein the said copolymer has an average molecular weight in the range of about 10,000 to 50,000.

7. The composition of claim 1 wherein the said copolymer has an average molecular weight of about 20,000.

8. The composition of claim 1 wherein the said resin has an average molecular weight in the range of from about 100,000 to about 700,000.

9. The composition of claim 1 wherein the said resin has an average molecular weight in the range of from about 100,000 to about 380,000.

10. The composition of claim 1 wherein the diazonium salt is the polycondensation product of 3-methoxy-4-diazo-diphenyl amine sulfate and 4,4'-bis-methoxy methyl-diphenyl ether, precipitated as mesitylene sulfonate.

11. The composition of claim 1 wherein the said resin has an average molecular weight in the range of from about 100,000 to about 380,000; and said polymer has an average molecular weight in the range of from about 10,000 to about 50,000; and wherein said diazonium salt is the polycondensation product of 3-methoxy-4-diazo-diphenyl amine sulfate and 4,4'-bis-methoxy methyl-diphenyl ether, precipitated a mesitylene sulfonate.

12. The composition of claim 1 further comprising one or more ingredients selected from the group consisting of exposure indicators, acid stabilizers and colorants.

13. A lithographic printing plate which comprises a substrate and the composition of claim 1 coated on said substrate.

14. A lithographic printing plate which comprises an aluminum containing substrate and the composition of claim 1 coated on said substrate.

15. A lithographic printing plate which comprises an aluminum containing substrate and the composition of claim 11 coated on said substrate.

16. A lithographic printing plate which comprises an aluminum containing substrate, at least one surface of which has been grained, anodized and hydrophilized; and the composition of claim 1 coated onto said treated surface.

17. A lithographic printing plate which comprises an aluminum containing substrate, at least one surface of which has been grained, anodized and treated with a polyvinyl phosphoric acid containing hydrophilizing composition; and the composition of claim 11 coated onto said treated surface.

18. A lithographic printing plate which comprises an aluminum containing substrate, at least one surface of which has been grained and hydrophilized; and the composition of claim 1 coated onto said treated surface.

* * * * *